(12) United States Patent
Awe et al.

(10) Patent No.: US 8,719,229 B1
(45) Date of Patent: May 6, 2014

(54) CLOUD PLATFORM FOR MANAGING DESIGN DATA

(71) Applicant: Autodesk, Inc., San Rafael, CA (US)

(72) Inventors: James Awe, Santa Rosa, CA (US); Johannes Leon Marais, Mountain View, CA (US); Jianfeng Guo, Shanghai (CN); Nathan James Pahucki, Miami, FL (US)

(73) Assignee: Autodesk, Inc., San Rafael, CA (US)

( * ) Notice: Subject to any disclaimer, the term of this patent is extended or adjusted under 35 U.S.C. 154(b) by 0 days.

(21) Appl. No.: 13/651,237

(22) Filed: Oct. 12, 2012

(51) Int. Cl.
*G06F 17/00* (2006.01)

(52) U.S. Cl.
USPC ............................ 707/649; 707/756; 707/806

(58) Field of Classification Search
USPC ........................ 707/649, 756, 806
See application file for complete search history.

(56) References Cited

U.S. PATENT DOCUMENTS

| | | | |
|---|---|---|---|
| 6,341,291 B1 | 1/2002 | Bentley et al. | |
| 6,652,256 B2 * | 11/2003 | Coe | 425/130 |
| 7,492,364 B2 * | 2/2009 | Devarajan et al. | 345/420 |
| 8,463,749 B2 * | 6/2013 | Zizys et al. | 707/649 |
| 2006/0224626 A1 | 10/2006 | Lakshminath et al. | |
| 2012/0054156 A1 | 3/2012 | Mason, Jr. | |

OTHER PUBLICATIONS

International Search Report and Written Opinion in International Patent Application No. PCT/US2012/063394, filed Nov. 2, 2012. Dated Oct. 7, 2013. 8 pages.

* cited by examiner

*Primary Examiner* — Pierre Vital
*Assistant Examiner* — Andalib Lodhi
(74) *Attorney, Agent, or Firm* — Fish & Richardson P.C.

(57) ABSTRACT

Methods, systems, and apparatus, including computer programs encoded on a computer storage medium, for receiving a first source file, the first source file including one or more first computer-aided design models; converting the first source file into a first plurality of files; generating a first snapshot, the first snapshot including the first source file, the first plurality of files, and a first version; receiving a second source file, the second source file having the first format that is readable by the first application, the second source file including one or more second models, the second source file being an updated version of the first source file; converting the second source file into a second plurality of files; generating a second snapshot; and associating the second snapshot with the first snapshot, where the second snapshot being a more recent version than the first snapshot.

30 Claims, 5 Drawing Sheets

CLOUD PLATFORM FOR MANAGING DESIGN DATA

BACKGROUND

This specification relates to computer aided design and, in particular, to managing design data of computer aided design systems.

Computer-aided design (CAD) systems utilize computers to allow users to create and modify designs of physical parts, piping systems, machines, and buildings, for example. The designs can be represented as three-dimensional (3-D) objects using solid modeling techniques implemented by different types of software. Solid modeling techniques model physical objects using so-called solid objects. A solid object is an object that represents the volume of a physical object and is formed by the application of one or more geometric primitives (e.g., box, wedge, cone, cylinder, sphere, and so on). Solid objects have can associated parameters that allow the solid objects to behave in ways during simulations that are consistent with the physical behavior of corresponding real objects. This allows CAD systems to provide simulation, planning and verification of manufacture and assembly. A model comprises one or more solid objects. Each CAD system can generate models in a data format that is different than that of the other CAD systems.

SUMMARY

The system described herein provides multiple means of user access to design data. A user can provide, to the system, design data that includes designs or models represented by a CAD system format. The design data can be accessed only by an application compatible with the CAD system format. The system converts the design data into many alternative formats. In addition, the system can index, version, or distribute the converted data and design data. Therefore, the converted data can be accessed by applications that are compatible with formats other than the original CAD system format.

Particular embodiments of the subject matter described in this specification can be implemented to realize one or more of the following advantages. Different CAD systems can utilize different electronic file formats for representing designs and models. Implementations described herein can allow users to access existing designs from different CAD systems through a server system. Users can view models of any format without having software of the corresponding CAD system installed on a user device that was used to author the model. The models and any subsequent modifications can be stored on and accessed from the server system. Each model can be converted into multiple format types for access by a user. Generally, as models go through various transformations, valuable information is lost. For example, metadata represented in one format, e.g., a subclass of material for a pipe, can be unrepresented in another format, e.g., the other format does not have a structure or interface to represent the subclass of material. However, the server system retains the valuable information as a design is transformed into multiple format types. Users can access statistics related to each model and search for particular models and designs using the server system.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
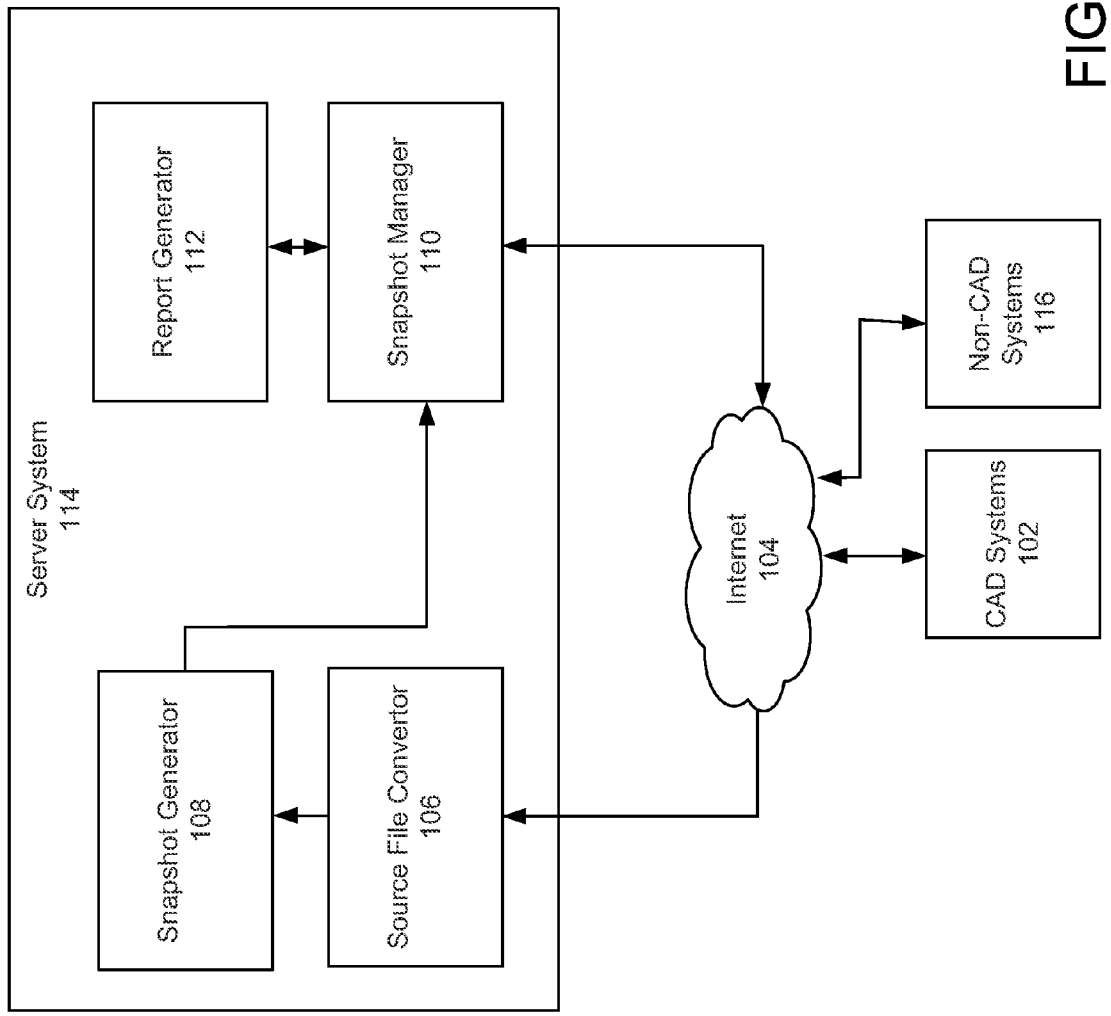
FIG. 1 is a diagram of an example cloud platform architecture for managing CAD systems.

FIG. 1 is a diagram of an example cloud platform architecture 100 for managing CAD systems. The architecture 100 can include a server system 114. The server system 114 can include one or more data processing apparatus such as rack-mounted servers or other computing devices. The data processing apparatus can be in the same physical location (e.g., data center) or they can be in different physical locations. The data processing apparatus can have different capabilities and computer architectures.

CAD systems 102 create and manage designs, e.g., designs of physical parts, which include one or more files that describe one or more models. The models can be stored in one or more different electronic file formats. For example, a file format can be a drawing ("DWG") binary file format for storing two and three dimensional design data and metadata. Another file format can be 3DS which is used for 3D modeling, animation, and rendering. In some implementations, a given CAD system may not be able to access or modify models generated by a different CAD system because of file format differences. For example, a CAD system for developing plumbing infrastructure may not be able to parse electronic files for a design of authored in another CAD system for electrical infrastructure. CAD systems can execute on servers or client side devices. The client side devices can have different capabilities and computer architectures. In some implementations, a client side device is an end-user device such as a personal computer, a laptop computer, a tablet computer, or a smart phone, for instance.

CAD systems 102 and non-CAD systems 116 can communicate with the server system 114 through a network, e.g., the Internet 104. Non-CAD systems 116 can include web browsers, mobile devices, tablets, or web services. In some implementations, after a user finalizes a version of a model using a CAD system, the CAD system sends the model files to the server system 114 for storage. (Management of multiple design files will be described further below in reference to FIG. 3.) In some implementations, CAD systems 102 or non-CAD systems 116, e.g., web browsers, send requests for access to other models maintained by the server system 114, and the server system 114 can respond to the requests with models in a file format that is compatible with the respective requesting CAD and non-CAD systems. This will be described further below in reference to FIG. 4. In some implementations, CAD systems 102 send their model files to a data management system, which forwards the files to the server system 114.

In various implementations, when a CAD system sends model files to the server system 114, the server system 114 converts the model files using a source file convertor 106. Generally, each model comprises one or more electronic files. For example, a model can include workflow abstractions, scheduling information, metadata, and standard deliverables. In some implementations, the model includes indexes of commonly searched data. The source file convertor 106 can convert a model file, also referred to as a "source file," into multiple file formats. Each file format can be compatible with a distinct CAD application, for example. In some implementations, the source file convertor 106 extracts 3-D geometry from each model and converts the geometry into generic data formats that can be accessed by multiple types of CAD or non-CAD systems. Some generic data formats can include locations, sizes, classes, weights of models, and how each model associates with other models. Some rich information, e.g., model metadata, thumbnails, 2D representations, or rendered images, may not be retained by the generic data formats due to format limitations. That is, the generic data formats are not complex enough to represent the rich information along with the generic data. However, the rich information will be retained in other formats, as will be described below.

In some implementations, the source file convertor 106 creates new derivative files to represent the rich information and links the new derivative files to the converted files. For example, each model can be rendered at a different angle and the rendered image can have a generic format, e.g., a JPEG image. The different renderings can later be provided to applications requesting access to some form of the rich information. For example, the applications can be lightweight and therefore capable of accessing the derivative files but incapable of accessing the rich information in its original unconverted form. Derivative files can also include any information that can be extracted from the rich information such as metadata properties (e.g., widths, heights, manufacturer names), alternative viewing formats (e.g., formats appropriate for mobile browsers), tables or other reports of data. The source file convertor 106 can link the rendered images to the converted model files. The server system 114 also retains the "source file," which includes links between the rich information and the models.

A snapshot generator 108 can create a snapshot of a model from output of the source file convertor 106. The snapshot is based on the converted files, derivative files, and the source files. Snapshots will be described below in reference to FIG. 2. Each snapshot can be stored in a storage system that is accessible to the server system 114. The storage system can be an electronic file system, a distributed file system or other network-accessible persistent storage which can store information on computer-readable storage media.

The snapshot generator 108 can send the snapshot to a snapshot manager 110. The snapshot manager 110 manages user access to generated snapshots. For example, a CAD or non-CAD system can request data from a snapshot over the Internet 104, and the snapshot manager 110 can respond to the CAD system with the request information. This will be described further below in reference to FIG. 5. Using a report generator 112, the snapshot manager 110 can provide a report based on a snapshot that is requested by a user. The report can include statistics or attributes of models in the snapshot. This will be described below in reference to FIG. 4.

Figure 2:
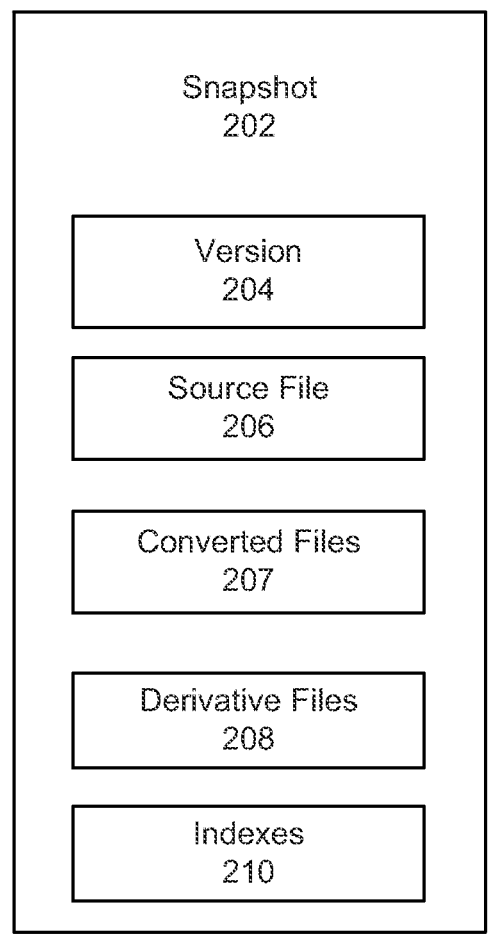
FIG. 2 is a diagram of an example snapshot for a model in a CAD system.

FIG. 2 is a diagram 200 of an example snapshot for a model in a CAD system. The snapshot is a collection of files that includes an original source file 206 (e.g., original model files, workflow abstractions, and standard deliverables), the converted files 207 (e.g., the files of different generic formats), and any newly created derivative files 208 (e.g., rich information). The snapshot includes links between objects and data, e.g., links between derivative files and the source file. In some implementations, the snapshot 202 includes search indexes 210, which will be described further below in reference to FIG. 5. In some implementations, the search indexes 210 can be generated by a snapshot generator, e.g., the snapshot generator 108 in reference to FIG. 1. The snapshot generator can also include a version 204 of the snapshot. The version can be a string, a number, or a combination of both, e.g., "v1.0". The version corresponds to one snapshot. If a CAD system uploads an update to the source file, the snapshot generator generates another snapshot based on the update and assigns an updated version number to the generated snapshot. In this way, the server system 114 can provide access to multiple versions of a model.

Figure 3:
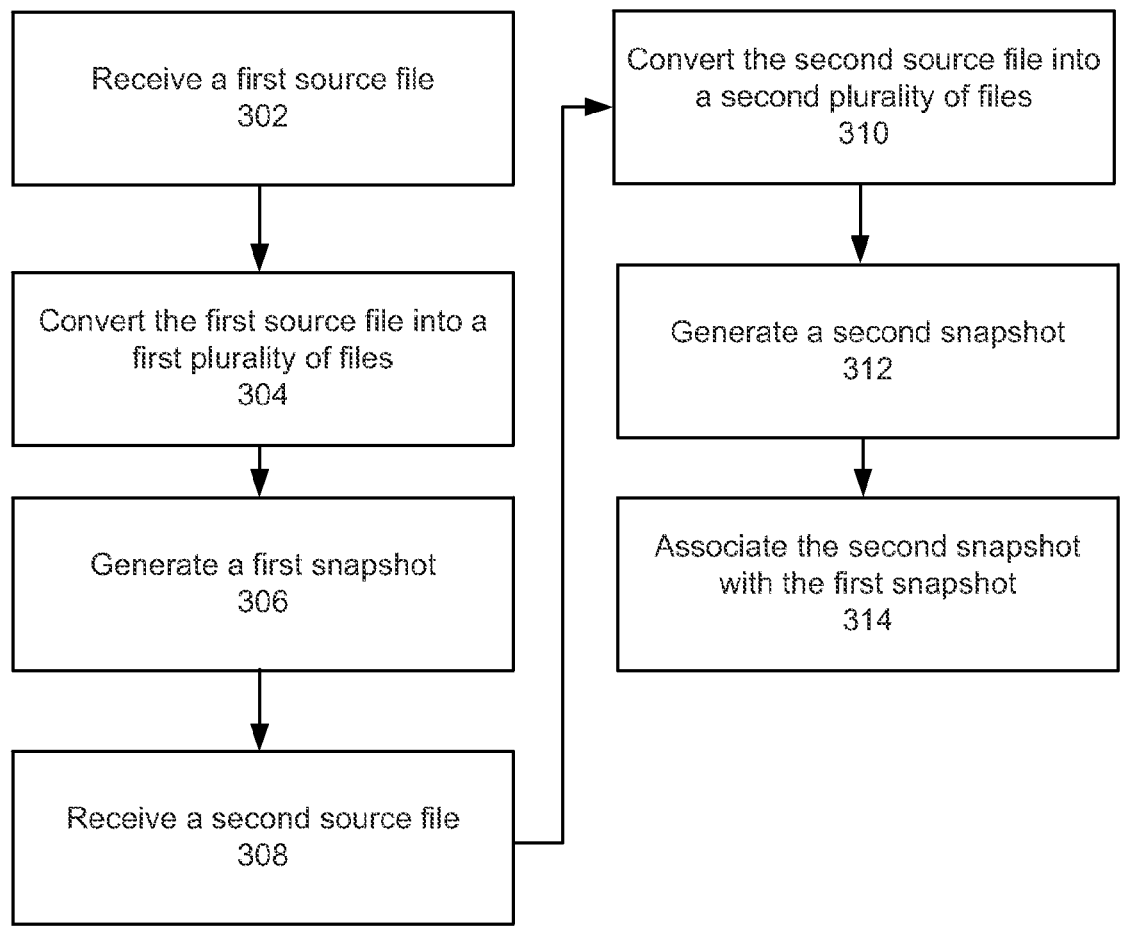
FIG. 3 is a flow chart of an example method for managing multiple models from one CAD system.

FIG. 3 is a flow chart of an example method for managing multiple models that are submitted from one CAD system. For convenience, the method 300 will be described with respect to a system, e.g., the server system 114 in reference to FIG. 1, having one or more computing devices that performs the method 300. The system receives a first design, e.g., a first source file, from a CAD system (step 302). The first source file can have a first format, e.g., a format readable by the CAD system but not by other CAD systems. As described above in reference to FIG. 1, the system converts the first source file into a collection of files having multiple formats (step 304). The system generates a first snapshot, e.g., using a snapshot generator (step 306). The system can receive a second source file from the CAD system (step 308). The second source file can be a modified version of the first source file. For example, the second source file can have an updated 3D model and additional design details compared to the first source file. The system converts the second source file into a second collection of files (step 310), e.g., similar to the converting above. In some implementations, the second collection of files includes derivative files having different formats than that of the first collection of files. The system generates a second snapshot based on the second collection of files and the second source file (step 312).

The system associates the second snapshot with the first snapshot (step 314). In some implementations, the system tracks the association using version numbers. For example, the second snapshot can be associated with a version number that is higher than the version number of the first snapshot. In some implementations, a version number is a timestamp of when the source file is uploaded.

Figure 4:
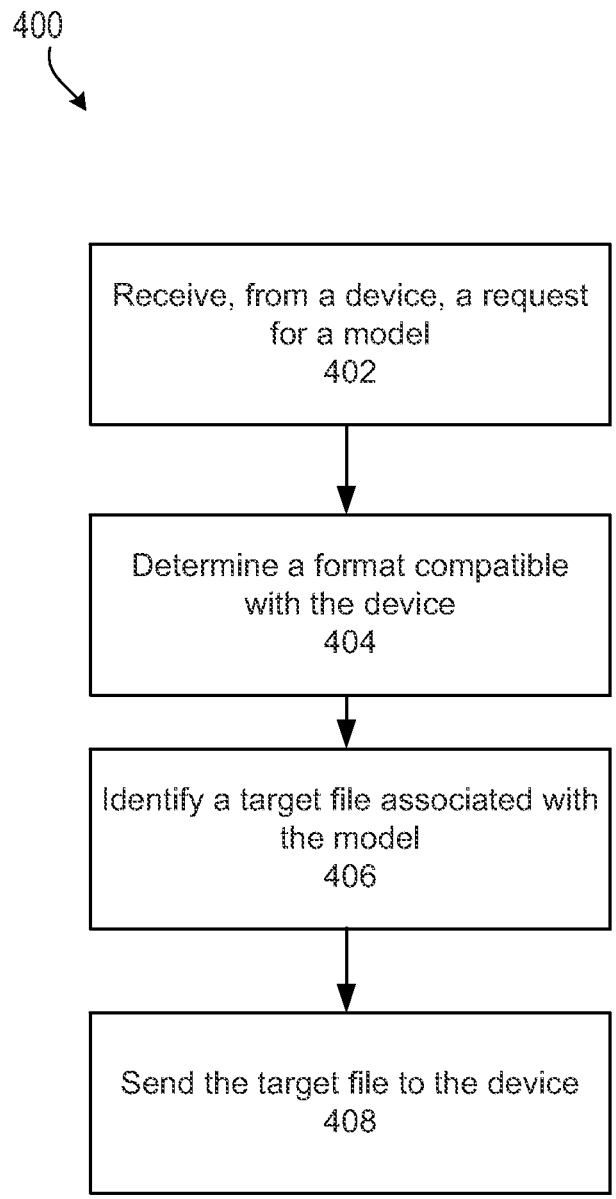
FIG. 4 is a flow chart of an example method for providing access to files in a model that is generated by a CAD system.

FIG. 4 is a flow chart of an example method for providing access to files in a model that is generated by a CAD system. For convenience, the method 400 will be described with respect to a system, e.g., the snapshot manager 110 of the server system 114 in reference to FIG. 1, having one or more computing devices that perform the method 400. The system receives a request from a device (step 402). The request can be for one or more models that are stored on the system. For example, the request can include a version number of a snapshot and include a particular model having certain attributes, e.g., a request for a model of a second floor of a building. In some implementations, the device has a CAD system installed that can access the original model file. In alternative implementations, the device does not have a compatible CAD system installed. The device can request for a model in a snapshot that is compatible with the CAD system.

The system determines a file format compatible with an application running on the device (step 404). The system can detect a device type and search for files that are compatible with the device type, e.g., by accessing a compatibility mapping in an external database between device types and compatible formats. In some implementations, the request includes a device type in headers of the request. In some other implementations, the headers can indicate an application format requested by the device. For example, the headers can show the device is sending the request through an Internet browser or mobile application. The system can determine the Internet browser or the mobile application is compatible with images, e.g., JPEG or GIF images, and not original model files. On the other hand, if the request is sent from CAD system software, the system can determine the compatible format is the format of the original model files.

The system identifies a target file associated with the model (step 406). Because the system has already converted the source file into many target files of different formats, the system can quickly retrieve a target file of an appropriate format based on the request. The request can identify a model within a snapshot that is stored on the system. As described above, the system includes a collection of files for each snapshot. The system identifies the target file within the collection of files, e.g., by checking the source file, converted files, and derivative files, that have the determined format and that are associated with the requested model. For example, the target file for a browser device type can be a JPEG image of a second floor of the model, while the target file for a device with a CAD system installed can be a model file that includes the second floor. The system sends the target file to the device (step 408). In some implementations, the system sends multiple target files to the device.

By way of illustration, a CAD application compatible with Format A can request a model having Format A. The system identifies a file from an appropriate snapshot having Format A. The system sends the file with Format A to the CAD application. On the other hand, a CAD application compatible with Format B or a non-CAD application can request a model having Format A. The system determines the application will require a generic format. The system identifies a derivative file with a generic format compatible with the application. The derivative file can be created from a model having Format A. The system then sends the derivative file to the application.

In some implementations, the device receives the target file and adds data associated with the file. For example, the user can add metadata to a model in the file, e.g., add personal notes describing the model. The device can send the associated data file back to the system and the system can store the associated data file with the corresponding snapshot. This enables other devices to access the associated data file from the system in the future.

Figure 5:
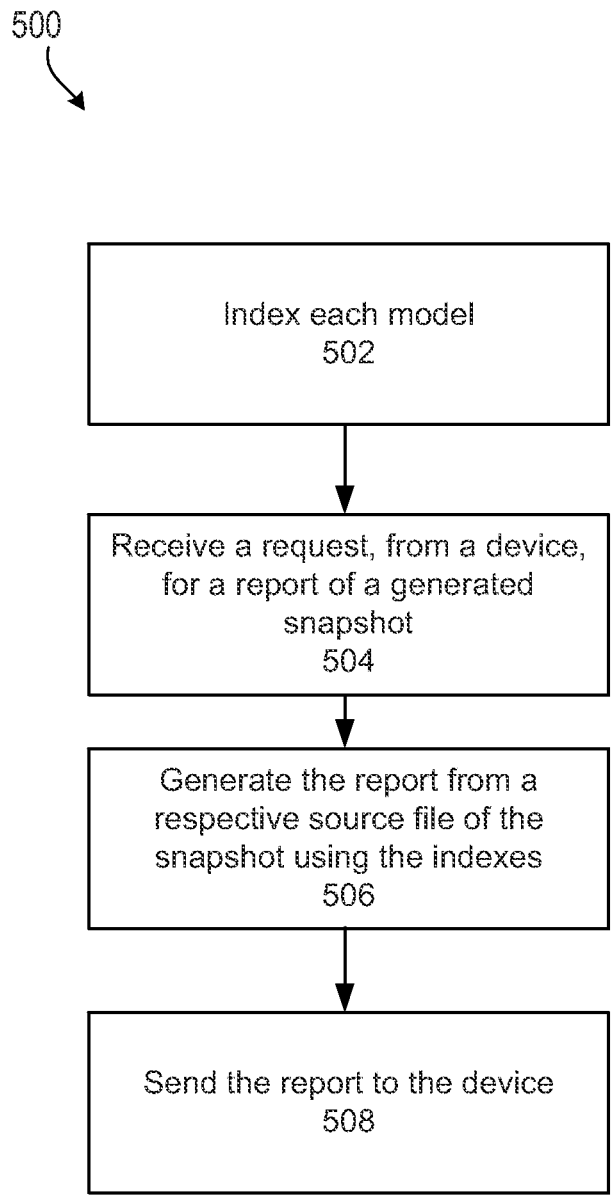
FIG. 5 is a flow chart of an example method of providing a report of a snapshot on the cloud platform.

FIG. 5 is a flow chart of an example method of providing a report of a snapshot on the cloud platform. For convenience, the method 500 will be described with respect to a system, e.g., the server system in reference to FIG. 1, having one or more computing devices that perform the method 500. In some implementations, when a design is uploaded, the system indexes each model in the design (step 502). The indexes for each model can be based on the design and one or more design parameters. The design parameters can include one or more of the following: coordinates of a model within a design space, name of a part, dimensions, class, weight, position, material type, or angle. In alternative implementations, the design includes indexes for each model in the design. For example, CAD systems can generate the indexes.

The system receives a request for a report of a snapshot (step 504). For example, a CAD system or a mobile device can request the report. For example, the CAD system can request for the number of specialty equipment on every floor of a building model. The system generates the report from a source file of the snapshot (step 506). In some implementations, the report is generated from derivative files of the snapshot. The report can be generated based on the already indexed information. The report can include statistics of the number of parts, attributes of part types, locations of parts, or other information about the design. In some implementations, designs have models that overlap each other in a design space, e.g., a structural component from one model can overlap in a coordinate position with the same component from another model. That is, models within one design can include duplicate components. When generating the report, the system can filter out one or more overlapping components based on whether coordinates between the components overlap. The system sends the report to the device (step 508).

In some implementations, a user can search snapshots on the system through search queries. Because each model is indexed by design parameter, users can search for models based on the design parameters. For example, the user can search for "fire doors with a rating of greater than 90 minutes." The system can locate models having design parameters satisfying the search query and present the models to the user for access.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. By way of further illustration, a data processing apparatus can be a touch screen enabled device such as a smart phone or a tablet computer. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a crossplatform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language resource), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending resources to and receiving resources from a device that is used by the user; for example, by sending web pages to a web browser on a user's client device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A method implemented by data processing apparatus, the method comprising:
receiving a first source file, the first source file having a first format that is readable by a first application, the first source file including one or more first computer-aided design models;
converting the first source file into a first plurality of files, where one or more files in the first plurality of files have a unique format that is readable by a respective application;
generating a first snapshot, the first snapshot including the first source file, the first plurality of files, and a first version;
receiving a second source file, the second source file having the first format that is readable by the first application, the second source file including one or more second models, the second source file being an updated version of the first source file;
converting the second source file into a second plurality of files, where one or more files in the second plurality of files have a unique format that is readable by a respective application;
generating a second snapshot, the second snapshot including the second source file, the second plurality of files, and a second version; and
associating the second snapshot with the first snapshot, where the second snapshot being a more recent version than the first snapshot.

2. The method of claim 1, further comprising:
receiving, from a device, a request for a model in one of the first and second snapshots;
determining a second format compatible with the device;
identifying a target file associated with the model in the requested snapshot, where the target file has the second format that is readable by a second application; and
sending the target file to the device.

3. The method of claim 2, further comprising:
receiving, from the device, a modified file based on the target file;
storing the modified file in a snapshot that is associated with the target file.

4. The method of claim 1, further comprising:
indexing each model in the first and second source files based on a plurality of design parameters, where one of the design parameters includes coordinates of a model within a design space.

5. The method of claim 4, where the design parameters include one or more of the following: name, dimensions, class, weight, position, material type, or angle.

6. The method of claim 4, further comprising:
receiving a request, from a device, for a report of a generated snapshot, where the request is a request for information about one or more models, and where the report includes statistics of the one or more models;
generating the report from a respective source file of the snapshot using the indexes;
sending the report to the device.

7. The method of claim 6, where in generating the report:
filtering out, from the statistics, one or more overlapping models, where the one or more overlapping models have overlapping coordinates with the one or more models.

8. The method of claim 4, further comprising:
receiving, from a device, a search query to search through one of the snapshots;
identifying one or more models that are relevant to the search query, where the identifying is based on the indexes; and
proving the one or more models to the device.

9. The method of claim 1, where the first or second source file is uploaded by a user.

10. The method of claim 1, where the first and second versions are based on timestamps.

11. A system comprising:
a processor; and
computer-readable medium coupled to the processor and having instructions stored thereon, which, when executed by the processor, cause the processor to perform operations comprising:
receiving a first source file, the first source file having a first format that is readable by a first application, the first source file including one or more first computer-aided design models;
converting the first source file into a first plurality of files, where one or more files in the first plurality of files have a unique format that is readable by a respective application;
generating a first snapshot, the first snapshot including the first source file, the first plurality of files, and a first version;
receiving a second source file, the second source file having the first format that is readable by the first application, the second source file including one or more second models, the second source file being an updated version of the first source file;
converting the second source file into a second plurality of files, where one or more files in the second plurality of files have a unique format that is readable by a respective application;
generating a second snapshot, the second snapshot including the second source file, the second plurality of files, and a second version; and
associating the second snapshot with the first snapshot, where the second snapshot being a more recent version than the first snapshot.

12. The system of claim 11, further comprising:
receiving, from a device, a request for a model in one of the first and second snapshots;
receiving, from a device, a request for a model in one of the first and second snapshots;
determining a second format compatible with the device;
identifying a target file associated with the model in the requested snapshot, where the target file has the second format that is readable by a second application;
determining a second format compatible with the device;
identifying a target file associated with the model in the requested snapshot, where the target file has the second format that is readable by a second application; and
sending the target file to the device.

13. The system of claim 12, further comprising:
receiving, from the device, a modified file based on the target file;
storing the modified file in a snapshot that is associated with the target file.

14. The system of claim 11, further comprising:
indexing each model in the first and second source files based on a plurality of design parameters, where one of the design parameters includes coordinates of a model within a design space.

15. The system of claim 14, where the design parameters include one or more of the following: name, dimensions, class, weight, position, material type, or angle.

16. The system of claim 14, further comprising;
receiving a request, from a device, for a report of a generated snapshot, where the request is a request for information about one or more models, and where the report includes statistics of the one or more models;
generating the report from a respective source file of the snapshot using the indexes;
sending the report to the device.

17. The system of claim 16, where in generating the report:
filtering out, from the statistics, one or more overlapping models, where the one or more overlapping models have overlapping coordinates with the one or more models.

18. The system of claim 14, further comprising:
receiving, from a device, a search query to search through one of the snapshots;
identifying one or more models that are relevant to the search query, where the identifying is based on the indexes; and
providing the one or more models to the device.

19. The system of claim 11, where the first or second source file is uploaded by a user.

20. The system of claim 11, where the first and second versions are based on timestamps.

21. A computer-readable storage medium having instructions stored thereon, which, when executed by a processor, cause the processor to perform operations comprising:
receiving a first source file, the first source file having a first format that is readable by a first application, the first source file including one or more first computer-aided design models;
converting the first source file into a first plurality of files, where one or more files in the first plurality of files have a unique format that is readable by a respective application;
generating a first snapshot, the first snapshot including the first source file, the first plurality of files, and a first version;
receiving a second source file, the second source file having the first format that is readable by the first application, the second source file including one or more second models, the second source file being an updated version of the first source file;
converting the second source file into a second plurality of files, where one or more files in the second plurality of files have a unique format that is readable by a respective application;
generating a second snapshot, the second snapshot including the second source file, the second plurality of files, and a second version; and
associating the second snapshot with the first snapshot, where the second snapshot being a more recent version than the first snapshot.

22. The computer-readable storage medium of claim 21, further comprising:
receiving, from a device, a request for a model in one of the first and second snapshots;
determining a second format compatible with the device;
identifying a target file associated with the model in the requested snapshot, where the target file has the second format that is readable by a second application; and
sending the target file to the device.

23. The computer-readable storage medium of claim 22, further comprising:
receiving, from the device, a modified file based on the target file;
storing the modified file in a snapshot that is associated with the target file.

24. The computer-readable storage medium of claim 21, further comprising:
indexing each model in the first and second source files based on a plurality of design parameters, where one of the design parameters includes coordinates of a model within a design space.

25. The computer-readable storage medium of claim 24, where the design parameters include one or more of the following: name, dimensions, class, weight, position, material type, or angle.

26. The computer-readable storage medium of claim 24, further comprising;
receiving a request, from a device, for a report of a generated snapshot, where the request is a request for information about one or more models, and where the report includes statistics of the one or more models;
generating the report from a respective source file of the snapshot using the indexes;
sending the report to the device.

27. The computer-readable storage medium of claim 26, where in generating the report:
filtering out, from the statistics, one or more overlapping models, where the one or more overlapping models have overlapping coordinates with the one or more models.

28. The computer-readable storage medium of claim 24, further comprising:
receiving, from a device, a search query to search through one of the snapshots;
identifying one or more models that are relevant to the search query, where the identifying is based on the indexes; and
providing the one or more models to the device.

29. The computer-readable storage medium of claim 21, where the first or second source file is uploaded by a user.

30. The computer-readable storage medium of claim 21, where the first and second versions are based on timestamps.

\* \* \* \* \*

UNITED STATES PATENT AND TRADEMARK OFFICE
CERTIFICATE OF CORRECTION

PATENT NO.         : 8,719,229 B1
APPLICATION NO.    : 13/651237
DATED              : May 6, 2014
INVENTOR(S)        : James Awe et al.

Page 1 of 1

It is certified that error appears in the above-identified patent and that said Letters Patent is hereby corrected as shown below:

In the Claims

In Claim 8, column 10, line 11, delete "proving" and insert -- providing --.

In Claim 12, column 10, lines 51-53, after "snapshots;" delete "receiving, from a device, a request for a model in one of the first and second snapshots;".

In Claim 12, column 10, lines 57-61, after "application;" delete "determining a second format compatible with the device; identifying a target file associated with the model in the requested snapshot, where the target file has the second format that is readable by a second application;".

Signed and Sealed this
Sixteenth Day of June, 2015

Michelle K. Lee
*Director of the United States Patent and Trademark Office*